United States Patent
Hori et al.

(10) Patent No.: US 10,184,191 B2
(45) Date of Patent: Jan. 22, 2019

(54) METHOD FOR MANUFACTURING SILICON CARBIDE SINGLE CRYSTAL

(71) Applicant: SUMITOMO ELECTRIC INDUSTRIES, LTD., Osaka-shi, Osaka (JP)

(72) Inventors: Tsutomu Hori, Itami (JP); Shunsaku Ueta, Itami (JP); Akira Matsushima, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 69 days.

(21) Appl. No.: 15/111,013

(22) PCT Filed: Nov. 21, 2014

(86) PCT No.: PCT/JP2014/080849
§ 371 (c)(1),
(2) Date: Jul. 12, 2016

(87) PCT Pub. No.: WO2015/107772
PCT Pub. Date: Jul. 23, 2015

(65) Prior Publication Data
US 2016/0340796 A1 Nov. 24, 2016

(30) Foreign Application Priority Data
Jan. 15, 2014 (JP) .................. 2014-005043

(51) Int. Cl.
C30B 23/02 (2006.01)
C30B 29/36 (2006.01)
(Continued)

(52) U.S. Cl.
CPC ............ *C30B 23/025* (2013.01); *C30B 23/06* (2013.01); *C30B 29/36* (2013.01); *C30B 33/00* (2013.01); *C30B 33/02* (2013.01)

(58) Field of Classification Search
CPC .......... C30B 29/30; C30B 23/00; C30B 23/02
See application file for complete search history.

(56) References Cited

U.S. PATENT DOCUMENTS 6,110,279 A * 8/2000 Kito ........................ C30B 23/00
117/105
6,328,796 B1 * 12/2001 Kub ........................ C30B 25/02
117/915
(Continued)

FOREIGN PATENT DOCUMENTS

JP 2006-143511 A 6/2006
JP 2009-102196 A 5/2009
(Continued)

*Primary Examiner* — Robert M Kunemund
(74) *Attorney, Agent, or Firm* — Drinker Biddle & Reath LLP

(57) ABSTRACT

Provided is a method for manufacturing a silicon carbide single crystal capable of easily separating a silicon carbide single crystal from a pedestal. The method includes the step of fixing a seed substrate to a pedestal with a stress buffer layer being interposed therebetween, the step of growing a silicon carbide single crystal on the seed substrate, the step of separating the silicon carbide single crystal from the pedestal at the stress buffer layer, and the step of removing a residue of the stress buffer layer adhering to the silicon carbide single crystal subjected to the step of separating.

11 Claims, 3 Drawing Sheets

(51) Int. Cl.
*C30B 23/06* (2006.01)
*C30B 33/00* (2006.01)
*C30B 33/02* (2006.01)

(56) References Cited

U.S. PATENT DOCUMENTS

2013/0068157 A1   3/2013  Sasaki et al.
2014/0158042 A1*  6/2014  Heo ..................... C30B 29/36
                                                   117/84

FOREIGN PATENT DOCUMENTS

| JP | 2009-298659 A | 12/2009 |
| JP | 2010-064918 A | 3/2010 |
| JP | 2013-067522 A | 4/2013 |

* cited by examiner

METHOD FOR MANUFACTURING SILICON CARBIDE SINGLE CRYSTAL

TECHNICAL FIELD

The present invention relates to a method for manufacturing a silicon carbide single crystal, and in particular to a method for manufacturing a silicon carbide single crystal performed using a stress buffer layer.

BACKGROUND ART

As a method for growing a silicon carbide single crystal (SiC single crystal), a sublimation method is known in which a silicon carbide single crystal is grown on a seed substrate (seed crystal) fixed to a pedestal by subliming a silicon carbide source material within a crucible. The silicon carbide single crystal is separated from the pedestal and then cut to have a predetermined thickness, and thereby a silicon carbide single crystal substrate is manufactured.

Japanese Patent Laying-Open No. 2009-102196 describes a method for manufacturing a silicon carbide single crystal in which a SiC single crystal grown by a sublimation method is separated from a seed crystal in an interface between the SiC single crystal and the seed crystal, at a position in the SiC single crystal.

Japanese Patent Laying-Open No. 2009-298659 describes a method for manufacturing a silicon carbide single crystal in which a crucible lid body (pedestal) is cut first in an interface between a seed crystal on which a SiC single crystal is grown and the crucible lid body to separate the SiC single crystal from the crucible lid body.

CITATION LIST

Patent Document

PTD 1: Japanese Patent Laying-Open No. 2009-102196
PTD 2: Japanese Patent Laying-Open No. 2009-298659

SUMMARY OF INVENTION

Technical Problem

However, in the method for manufacturing the silicon carbide single crystal described in Japanese Patent Laying-Open No. 2009-102196, it is difficult to separate the SiC single crystal from the seed crystal, because silicon carbide is a highly hard, difficult-to-cut material.

On the other hand, in the method for manufacturing the silicon carbide single crystal described in Japanese Patent Laying-Open No. 2009-298659, a portion of the crucible lid body remains on the silicon carbide single crystal separated from the crucible lid body by cutting the crucible lid body. Accordingly, the step of removing the crucible lid body remaining on the silicon carbide single crystal is additionally required to fabricate a silicon carbide single crystal substrate from the silicon carbide single crystal.

Furthermore, although it is described that the step of removing is performed in the step of grinding or polishing the SiC single crystal, when the crucible lid body made of a carbon material is processed with a grindstone used to process silicon carbide, the grindstone tends to be clogged. This is not preferable for not only the step of polishing but also the step of processing silicon carbide.

The present invention has been made to solve the aforementioned problems. A main object of the present invention is to provide a method for manufacturing a silicon carbide single crystal capable of easily separating a silicon carbide single crystal from a pedestal. Another object of the present invention is to provide a method for manufacturing a silicon carbide single crystal which can be easily processed into a silicon carbide single crystal substrate.

Solution to Problem

A method for manufacturing a silicon carbide single crystal in accordance with the present invention includes the steps of fixing a seed substrate to a pedestal with a stress buffer layer being interposed therebetween, growing a silicon carbide single crystal on the seed substrate, separating the silicon carbide single crystal from the pedestal at the stress buffer layer, and removing a residue of the stress buffer layer adhering to the silicon carbide single crystal subjected to the step of separating.

Advantageous Effects of Invention

According to the present invention, a method for manufacturing a silicon carbide single crystal capable of easily separating a silicon carbide single crystal from a pedestal can be provided. Further, a method for manufacturing a silicon carbide single crystal which can be easily processed into a silicon carbide single crystal substrate can be provided.

DESCRIPTION OF EMBODIMENTS

Figure 1:
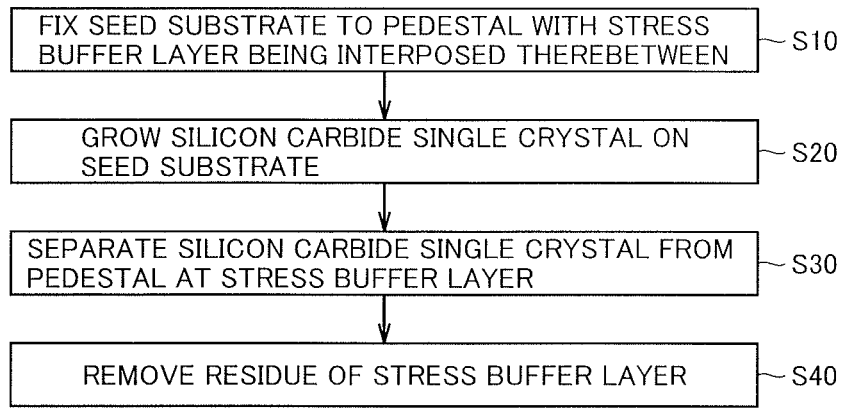
FIG. 1 is a flowchart of a method for manufacturing a silicon carbide single crystal in accordance with the present embodiment.

Hereinafter, an embodiment of the present invention will be described with reference to the drawings. It should be noted that, in the drawings below, identical or corresponding parts will be designated by the same reference numerals, and the description thereof will not be repeated.

First, an overview of the embodiment of the present invention will be described.

Description of Embodiment of the Invention of the Present Application (1) A method for manufacturing a silicon carbide single crystal in accordance with the present embodiment includes the step of fixing a seed substrate 10 to a pedestal 20 with a stress buffer layer 30 being interposed therebetween (S10), the step of growing a silicon carbide single crystal 50 on seed substrate 10 (S20), the step of separating silicon carbide single crystal 50 from pedestal 20 at stress buffer layer 30 (S30), and the step of removing a residue of stress buffer layer 30 adhering to silicon carbide single crystal 50 subjected to the step of separating (S30) (S40).

Here, stress buffer layer 30 is formed between seed substrate 10 and pedestal 20 to buffer a stress to be applied to seed substrate 10 due to a difference in thermal expansion coefficient between silicon carbide constituting seed substrate 10 and a material constituting pedestal 20.

That is, stress buffer layer 30 is less hard than silicon carbide constituting seed substrate 10, and is easily processed. Therefore, silicon carbide single crystal 50 can be easily separated from pedestal 20 by separating silicon carbide single crystal 50 from pedestal 20 at stress buffer layer 30 in the step of separating (S30). Further, although a residue 31 of stress buffer layer 30 remains on a fourth main surface 10B of seed substrate 10 by cutting stress buffer layer 30 in the step of separating (S30), residue 31 can be easily removed in the step of removing (S40) without being ground, polished, or the like (the detail thereof will be described later).

That is, according to the method for manufacturing the silicon carbide single crystal in accordance with the present embodiment, silicon carbide single crystal 50 can be easily separated from pedestal 20. Further, silicon carbide single crystal 50 obtained as described above can be easily processed into a silicon carbide single crystal substrate.

(2) In the method for manufacturing the silicon carbide single crystal in accordance with the present embodiment, in the step of separating (S30), silicon carbide single crystal 50 may be separated from pedestal 20 at stress buffer layer 30 by pressing a wire 60 extending in a direction along a main surface (a first main surface 30A) of stress buffer layer 30, from an end surface 30E of stress buffer layer 30 into stress buffer layer 30.

Thereby, by using wire 60 which is longer than the outer diameter of stress buffer layer 30 and thinner than the thickness of stress buffer layer 30, stress buffer layer 30 which fixes between seed substrate 10 and pedestal 20 can be easily cut, and silicon carbide single crystal 50 can be easily separated from pedestal 20.

(3) In the method for manufacturing the silicon carbide single crystal in accordance with the present embodiment, in the step of separating (S30), silicon carbide single crystal 50 may be separated from pedestal 20 at stress buffer layer 30 by emitting a laser beam to stress buffer layer 30.

Thereby, stress buffer layer 30 which fixes between seed substrate 10 and pedestal 20 can be easily cut, and silicon carbide single crystal 50 can be easily separated from pedestal 20.

(4) In the method for manufacturing the silicon carbide single crystal in accordance with the present embodiment, in the step of removing the residue (S40), residue 31 of stress buffer layer 30 may be removed by heating silicon carbide single crystal 50 under an oxygen-containing atmosphere.

That is, stress buffer layer 30 can be made of a material which can be oxidized and removed at a predetermined temperature, and residue 31 of such a stress buffer layer 30 can be easily removed by heating silicon carbide single crystal 50 under the oxygen-containing atmosphere.

(5) The method for manufacturing the silicon carbide single crystal in accordance with the present embodiment may further include the step of heating silicon carbide single crystal 50 under an inert gas atmosphere (S50), wherein the step of heating (S50) may be continuously performed after the step of removing the residue (S40).

Here, continuously performing the step of heating (S50) after the step of removing the residue (S40) refers to, for example, performing the step of removing the residue (S40) as a preceding stage of a series of temperature-increasing processes in the step of heating (S50), and thereafter performing the step of heating (S50) as a subsequent stage under changed atmosphere and heating temperature, without decreasing the heating temperature between these two steps.

Thereby, residue 31 of stress buffer layer 30 can be easily removed from silicon carbide single crystal 50 as part of the step of heating silicon carbide single crystal 50 under the inert gas atmosphere (S50) (for example, an activation annealing treatment step). As a result, manufacturing steps can be decreased and manufacturing cost can be reduced, when compared with a case where the step of removing the residue (S40) and the step of heating (S50) are performed individually in the method for manufacturing the silicon carbide single crystal. Further, silicon carbide single crystal 50 obtained as described above can be easily processed into a silicon carbide single crystal substrate.

Details of Embodiment of the Invention of the Present Application

Next, the embodiment of the present invention will be described in more detail.

First, the method for manufacturing the silicon carbide single crystal in accordance with the present embodiment will be described with reference to FIG. 1. The method for manufacturing the silicon carbide single crystal in accordance with the present embodiment includes the step of fixing seed substrate 10 to pedestal 20 with stress buffer layer 30 being interposed therebetween (S10), the step of growing silicon carbide single crystal 50 on seed substrate 10 (S20), the step of separating silicon carbide single crystal 50 from pedestal 20 at stress buffer layer 30 (S30), and the step of removing a residue of stress buffer layer 30 adhering to silicon carbide single crystal 50 subjected to the step of separating (S30) (S40).

Figure 2:
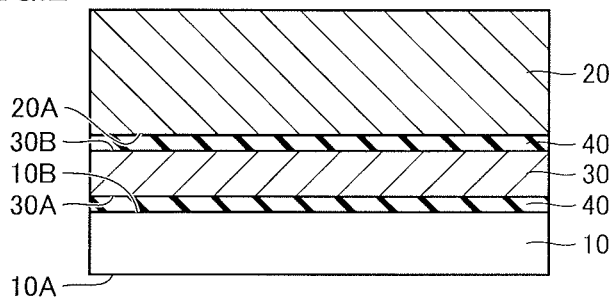
FIG. 2 is a cross sectional view for illustrating the method for manufacturing the silicon carbide single crystal in accordance with the present embodiment.

First, referring to FIG. 2, the seed substrate is fixed to the pedestal with the stress buffer layer being interposed therebetween (step (S10)). Specifically, first, seed substrate 10, pedestal 20, and stress buffer layer 30 are prepared. Stress buffer layer 30 is made of a material which is less hard and more flexible and elastic than seed substrate 10 and silicon carbide single crystal 50. The material constituting stress buffer layer 30 is a graphite sheet, for example. Stress buffer layer 30 has first main surface 30A and a second main surface 30B located opposite to first main surface 30A.

Seed substrate 10 is a single crystal made of silicon carbide. Preferably, silicon carbide constituting seed substrate 10 has a hexagonal crystal structure. In addition, preferably, the crystal structure has a polytype of 4H or 6H. Seed substrate 10 has a third main surface (growth surface) 10A on which silicon carbide single crystal 50 (see FIG. 3) is to be grown, and a fourth main surface 10B which is located opposite to third main surface 10A and is to be bonded with first main surface 30A of stress buffer layer 30. Third main surface 10A is a surface having an off angle of less than or equal to 10 degrees with respect to a (0001) plane, for example. Preferably, each of third main surface 10A and fourth main surface 10B has a high flatness. The outer diameter of seed substrate 10 in third main surface 10A is more than or equal to 100 mm, for example, and is preferably more than or equal to 150 mm.

Pedestal 20 is made of graphite, for example. Pedestal 20 has a fifth main surface 20A provided to be able to hold seed substrate 10 when silicon carbide single crystal 50 is grown on third main surface 10A of seed substrate 10 by the sublimation method. The width of fifth main surface 20A (distance between end portions in a direction along third main surface 10A) is more than or equal to the outer diameter of seed substrate 10 in third main surface 10A.

The width of stress buffer layer 30 in first main surface 30A is provided to be nearly equal to the outer diameter of seed substrate 10 in third main surface 10A, and is more than or equal to 100 mm, for example, and is preferably more than or equal to 150 mm. The thickness of stress buffer layer 30 is more than or equal to 0.1 mm and less than or equal to 3 mm, for example.

Next, prepared seed substrate 10, pedestal 20, and stress buffer layer 30 are bonded, with an adhesive 40 being interposed therebetween.

Adhesive 40 may be made of any material provided to be curable at a predetermined temperature (for example, more than or equal to 1000° C.). Adhesive 40 is a carbon adhesive, for example. The carbon adhesive is an adhesive having carbon powder dispersed in a solvent, in which the solvent is to be volatilized by heat treatment so that an adhesive layer substantially made of carbon only can be formed. Since pedestal 20 contains carbon and adhesive 40 is a carbon adhesive, second main surface 30B of stress buffer layer 30 and fifth main surface 20A of pedestal 20 are firmly bonded, with adhesive 40 being interposed therebetween. Specific examples of the carbon adhesive can include a carbon adhesive in which carbon powder is mixed into a phenol resin and phenol and ethyl alcohol are contained as solvents.

Adhesive 40 is applied between fourth main surface 10B of seed substrate 10 and first main surface 30A of stress buffer layer 30, and between second main surface 30B of stress buffer layer 30 and fifth main surface 20A of pedestal 20, and thereafter adhesive 40 is cured by heating these components at the predetermined temperature described above, to fix seed substrate 10, stress buffer layer 30, and pedestal 20.

On this occasion, heating treatment in the step of fixing (S10) may be performed by any method, and may be performed in two stages, using a hot plate, a lamp annealing device, a constant-temperature bath, or the like, for example. Specifically, heating may be performed at a temperature at which the solvent contained in adhesive 40 can be volatilized to some extent, for example, at a predetermined temperature of more than or equal to 100° C. and less than or equal to 400° C., and thereafter heating may be performed at a temperature at which adhesive 40 can be cured, for example, at a predetermined temperature of more than or equal to 400° C. The time for heat treatment is, for example, more than or equal to 5 minutes and less than or equal to 60 minutes after the predetermined temperature is reached. Thereby, by curing adhesive 40, seed substrate 10 can be fixed to pedestal 20 with stress buffer layer 30 being interposed therebetween.

Figure 3:
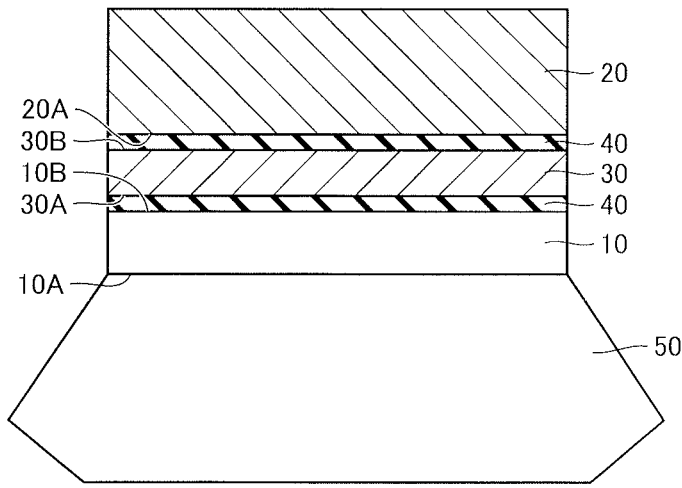
FIG. 3 is a cross sectional view for illustrating the method for manufacturing the silicon carbide single crystal in accordance with the present embodiment.

Next, referring to FIG. 3, silicon carbide single crystal 50 is grown on seed substrate 10 (step (S20)). Specifically, pedestal 20 having seed substrate 10 fixed thereto with stress buffer layer 30 being interposed therebetween is mounted in a crucible (not shown) which stores a source material (not shown) therein. Pedestal 20 is mounted in the crucible such that third main surface 10A of seed substrate 10 faces the inside of the crucible. The crucible is constituted to contain a carbon source material, for example. The source material is stored within the crucible. The source material is silicon carbide powder, for example. Further, the crucible is provided such that it can be heated to a predetermined temperature described later by a heating portion (not shown) arranged around the periphery thereof.

Next, by subliming the source material, a sublimate is deposited on third main surface 10A of seed substrate 10, and thereby silicon carbide single crystal 50 is grown. The temperature in this sublimation-recrystallization method is set to more than or equal to 2100° C. and less than or equal to 2500° C., for example. In addition, the pressure in this sublimation-recrystallization method is preferably set to more than or equal to 1.3 kPa and less than or equal to the atmospheric pressure, and more preferably set to less than or equal to 13 kPa to increase a growth rate. Thereby, referring to FIG. 3, silicon carbide single crystal 50 grown on seed substrate 10 fixed to pedestal 20 with stress buffer layer 30 being interposed therebetween can be obtained.

Figure 4:
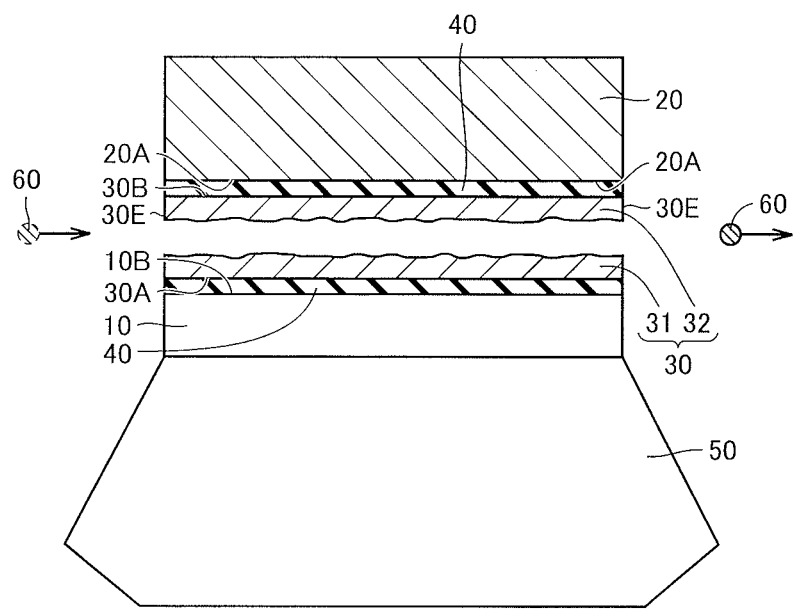
FIG. 4 is a cross sectional view for illustrating the method for manufacturing the silicon carbide single crystal in accordance with the present embodiment.

Next, referring to FIG. 4, silicon carbide single crystal 50 is separated from pedestal 20 at stress buffer layer 30 (step (S30)). Specifically, first, wire 60 is prepared as a device for separating silicon carbide single crystal 50 from pedestal 20. As wire 60, a wire having a length longer than the outer diameter of first main surface 30A of stress buffer layer 30 and a thickness smaller than the thickness of stress buffer layer 30 is prepared. Next, wire 60 is caused to extend in the direction along first main surface 30A of stress buffer layer 30, and is pressed from end surface 30E of stress buffer layer 30 (a surface along a direction perpendicular to first main surface 30A) into stress buffer layer 30. The position where wire 60 is pressed into end surface 30E of stress buffer layer 30 may be a central portion of end surface 30E, or a position closer to seed substrate 10 or pedestal 20 with respect to the central portion.

By pressing wire 60 from one end surface 30E of stress buffer layer 30 to reach the other end surface 30E opposite thereto with first main surface 30A being sandwiched therebetween, silicon carbide single crystal 50 can be separated from pedestal 20 at stress buffer layer 30. Silicon carbide single crystal 50 after being separated from pedestal 20 is formed integrally with seed substrate 10 and residue 31 of stress buffer layer 30 bonded on fourth main surface 10B of seed substrate 10 with adhesive 40 being interposed therebetween. It should be noted that a residue 32 of stress buffer layer 30 is also formed on fifth main surface 20A of pedestal 20 with adhesive 40 being interposed therebetween.

Figure 5:
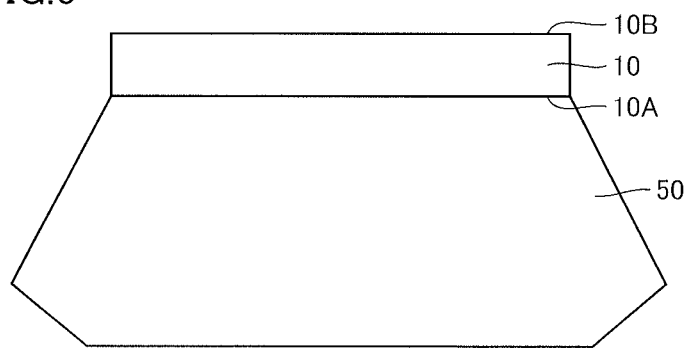
FIG. 5 is a cross sectional view for illustrating the method for manufacturing the silicon carbide single crystal in accordance with the present embodiment.

Next, residue 31 of stress buffer layer 30 adhering to silicon carbide single crystal 50 subjected to the step of separating (S30) is removed (step (S40)). Specifically, silicon carbide single crystal 50 separated from pedestal 20 in the previous step (S30) is heated under an oxygen-containing atmosphere. The oxygen-containing atmosphere may be an oxygen atmosphere having an oxygen concentration higher than that of the air, or may be an atmosphere having an oxygen concentration nearly equal to that of the air, or may be the air. To perform this step (S40), any device capable of heating silicon carbide single crystal 50 to a predetermined temperature under the oxygen-containing atmosphere can be used, and for example, an atmospheric furnace can be used. The heating temperature may be set to any temperature at which stress buffer layer 30 can be oxidized and removed, and may be set to, for example, a predetermined temperature of more than or equal to 1000° C. The heating time may be set to any time for which stress buffer layer 30 can be oxidized and removed, and may be set to, for example, more than or equal to 30 minutes and less than or equal to 48 hours after the predetermined temperature is reached. Thereby, residue 31 of stress buffer layer 30 can be removed as shown in FIG. 5.

Silicon carbide single crystal 50 obtained as described above is sliced after its side surface extending in a direction intersecting with third main surface 10A of seed substrate 10 is ground. Thereby, a silicon carbide single crystal substrate can be obtained.

Next, the function and effect of the method for manufacturing the silicon carbide single crystal in accordance with the present embodiment will be described. According to the method for manufacturing the silicon carbide single crystal in accordance with the present embodiment, in the step of separating (S30), silicon carbide single crystal 50 is separated from pedestal 20 at stress buffer layer 30. Here, stress buffer layer 30 is less hard than silicon carbide constituting seed substrate 10, and is easily processed. Therefore, silicon carbide single crystal 50 can be easily separated from pedestal 20.

Further, in the step of removing (S40), residue 31 of stress buffer layer 30 can be easily removed without being ground, polished, or the like. Thus, silicon carbide single crystal 50 can be easily separated from pedestal 20 without processing pedestal 20 made of a carbon material with a grindstone used to process silicon carbide, for example. That is, according to the method for manufacturing the silicon carbide single crystal in accordance with the present embodiment, silicon carbide single crystal 50 can be easily separated from pedestal 20.

Further, since stress buffer layer 30 is made of a material which can be oxidized and removed at a predetermined temperature, residue 31 of stress buffer layer 30 can be easily removed by heating silicon carbide single crystal 50 under the oxygen-containing atmosphere in the step of removing the residue (S40). Thereby, silicon carbide single crystal 50 can be easily processed into a silicon carbide single crystal substrate.

The method for manufacturing the silicon carbide single crystal in accordance with the present embodiment is applicable to seed substrate 10 with any thickness. Even when seed substrate 10 has a thin thickness of, for example, more than or equal to about several tens of micrometers and less than or equal to about several hundreds of micrometers, silicon carbide single crystal 50 can be easily separated from pedestal 20 without wasting silicon carbide single crystal 50 as a cutting allowance.

Further, although first main surface 30A of stress buffer layer 30, third main surface 10A of seed substrate 10, and fifth main surface 20A of pedestal 20 are all formed in circular shapes in accordance with the shape of seed substrate 10 in the method for manufacturing the silicon carbide single crystal in accordance with the present embodiment, their shapes are not limited thereto. Even when they have any shapes, the same effect as that of the method for manufacturing the silicon carbide single crystal in accordance with the present embodiment can be exhibited.

Further, although the step of separating (S30) is performed using wire 60 in the method for manufacturing the silicon carbide single crystal in accordance with the present embodiment, the step of separating is not limited thereto. The step of separating (S30) may be performed, for example, using a member in which wire 60 is incorporated into a coping saw (for example, a member in which wire 60 is provided to connect two opposite end portions of a base body having a U-shaped planar shape), by pressing wire 60 from end surface 30E of stress buffer layer 30 into stress buffer layer 30. Furthermore, the step of separating (S30) may be performed using a spatulate member which has a flat portion and in which the thickness of the flat portion is thinner than the thickness of stress buffer layer 30, by pressing the flat portion from end surface 30E of stress buffer layer 30 into stress buffer layer 30. Also thereby, the same effect as that of the method for manufacturing the silicon carbide single crystal in accordance with the present embodiment can be exhibited.

Figure 6:
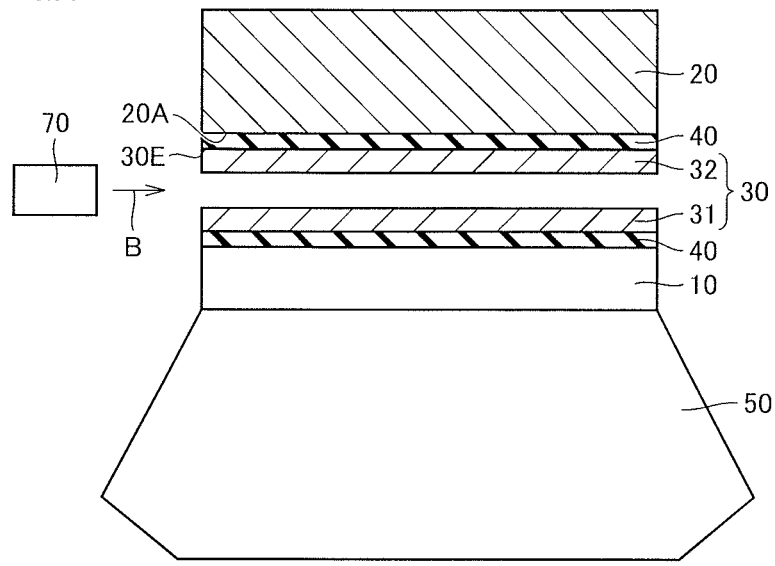
FIG. 6 is a cross sectional view for illustrating a variation of the method for manufacturing the silicon carbide single crystal in accordance with the present embodiment.

Further, referring to FIG. 6, a laser light source 70 may be used. In this case, a laser beam having a spot diameter smaller than the thickness of end surface 30E of stress buffer layer 30 may be emitted from laser light source 70 to end surface 30E. Also thereby, stress buffer layer 30 can be cut at the portion subjected to the laser beam, and the same effect as that of the method for manufacturing the silicon carbide single crystal in accordance with the present embodiment can be exhibited. Furthermore, a high-pressure water flow may be injected to end surface 30E of stress buffer layer 30, Also thereby, stress buffer layer 30 can be cut at the portion subjected to the injected high-pressure water flow, and the same effect as that of the method for manufacturing the silicon carbide single crystal in accordance with the present embodiment can be exhibited.

Figure 7:
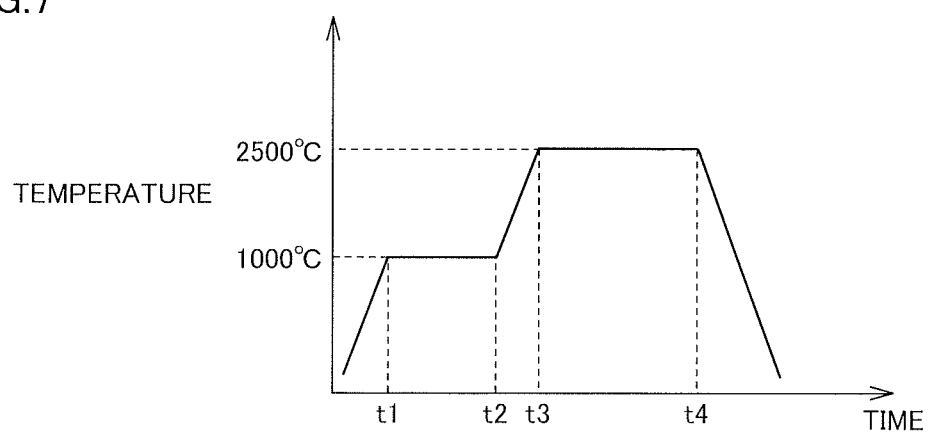
FIG. 7 is a graph for illustrating a heating temperature condition in the step of removing a residue in the variation of the method for manufacturing the silicon carbide single crystal in accordance with the present embodiment.

Although the step of removing (S40) is performed by heat-treating the silicon carbide single crystal under the oxygen-containing atmosphere in the method for manufacturing the silicon carbide single crystal in accordance with the present embodiment, the step of removing (S40) may be performed in combination with any heat-treatment step. Referring to FIG. 7, for example, the step of removing (S40) may be performed as a preceding stage of the step of heating silicon carbide single crystal 50 under an inert gas atmosphere (S50). In this case, the step of heating (S50) may be performed by changing the oxygen-containing atmosphere to an inert gas atmosphere such as an Ar (argon) gas atmosphere, for example, and increasing the heating temperature to a predetermined temperature without decreasing the heating temperature, after the step of removing residue 31 (S40) is performed. The step of heating (S50) can be, for example, an activation annealing step. Hereinafter, a description will be given with reference to FIG. 7.

In FIG. 7, the axis of ordinates represents temperature (unit: ° C.), and the axis of abscissas represents time (unit: minute). Referring to FIG. 7, for example, silicon carbide single crystal 50 may be heated to a temperature of 1000° C. under the oxygen-containing atmosphere and held for 30 minutes (from a time point t1 to a time point t2 in FIG. 7) as the step of removing (S40), and thereafter, continuously and without decreasing the heating temperature, silicon carbide single crystal 50 may be heated to a temperature of 2500° C. under the Ar gas atmosphere and held for 30 minutes (from a time point t3 to a time point t4 in FIG. 7) as the step of heating (S50). Thereby, the number of manufacturing steps can be decreased and manufacturing cost can be reduced, when compared with a case where the step of removing the residue (S40) and the step of heating (S50) are performed individually. Further, silicon carbide single crystal 50 obtained as described above can be easily processed into a silicon carbide single crystal substrate.

In other words, the step of removing the residue (S40) may be performed as a preceding stage of a series of temperature-increasing processes in the step of heating (S50), and thereafter the step of heating (S50) may be performed as a subsequent stage under changed atmosphere and heating temperature.

Thereby, residue 31 of stress buffer layer 30 can be easily removed from silicon carbide single crystal 50 as part of the step of heating silicon carbide single crystal 50 under the inert gas atmosphere (S50) (for example, an activation annealing treatment step). As a result, by using silicon carbide single crystal 50 obtained as described above, silicon carbide single crystal 50 can be easily processed into a silicon carbide single crystal substrate.

Further, the step of removing (S40) is not limited to heat-treating the silicon carbide single crystal under an oxygen-containing atmosphere. For example, the step of removing (S40) may be performed by mechanical processing such as sand blast processing, or residue 31 may be artificially removed using a spatulate member or the like. Further, residue 31 may be removed by wet etching, for example by being immersed in sulfuric acid and hydrogen peroxide (SPM). Also thereby, residue 31 can be easily removed.

Although the embodiment of the present invention has been described above, it is also possible to modify the embodiment described above in various manners.

Further, the scope of the present invention is not limited to the embodiment described above. The scope of the present invention is defined by the scope of the claims, and is intended to include any modifications within the scope and meaning equivalent to the scope of the claims.

INDUSTRIAL APPLICABILITY

The present invention is particularly advantageously applicable to a method for manufacturing a silicon carbide single crystal which can be processed into a silicon carbide single crystal substrate having a large diameter and a high crystallinity.

REFERENCE SIGNS LIST

10: seed substrate; 10A: third main surface; 10B: fourth main surface; 20: pedestal; 20A: fifth main surface; 30: stress buffer layer; 30A: first main surface; 30B: second main surface; 30E: end surface; 31, 32: residue; 40: adhesive; 50: single crystal; 60: wire; 70: laser light source.

The invention claimed is:

1. A method for manufacturing a silicon carbide single crystal, comprising the steps of:
    fixing a seed substrate to a pedestal with a stress buffer layer being interposed therebetween;
    growing a silicon carbide single crystal on the seed substrate;
    separating the silicon carbide single crystal from the pedestal at the stress buffer layer;
    removing a residue of the stress buffer layer adhering to the silicon carbide single crystal subjected to the step of separating; and
    the step of fixing the seed substrate includes a step of bonding the stress buffer layer and the pedestal with a first adhesive layer and a step of bonding the stress buffer layer and the seed substrate with a second adhesive layer.

2. The method for manufacturing the silicon carbide single crystal according to claim 1, wherein, in the step of separating, the silicon carbide single crystal is separated from the pedestal at the stress buffer layer by pressing a wire extending in a direction along a main surface of the stress buffer layer, from an end surface of the stress buffer layer into the stress buffer layer.

3. The method for manufacturing the silicon carbide single crystal according to claim 1, wherein, in the step of separating, the silicon carbide single crystal is separated from the pedestal at the stress buffer layer by emitting a laser beam to the stress buffer layer.

4. The method for manufacturing the silicon carbide single crystal according to claim 1, wherein, in the step of removing the residue, the residue of the stress buffer layer is removed by heating the silicon carbide single crystal under an oxygen-containing atmosphere.

5. The method for manufacturing the silicon carbide single crystal according to claim 4, further comprising the step of heating the silicon carbide single crystal under an inert gas atmosphere,
    wherein the step of heating is continuously performed after the step of removing the residue.

6. The method for manufacturing the silicon carbide single crystal according to claim 2, wherein, in the step of removing the residue, the residue of the stress buffer layer is removed by heating the silicon carbide single crystal under an oxygen-containing atmosphere.

7. The method for manufacturing the silicon carbide single crystal according to claim 3, wherein, in the step of removing the residue, the residue of the stress buffer layer is removed by heating the silicon carbide single crystal under an oxygen-containing atmosphere.

8. The method for manufacturing the silicon carbide single crystal according to claim 6, further comprising the step of heating the silicon carbide single crystal under an inert gas atmosphere,
    wherein the step of heating is continuously performed after the step of removing the residue.

9. The method for manufacturing the silicon carbide single crystal according to claim 7, further comprising the step of heating the silicon carbide single crystal under an inert gas atmosphere,
    wherein the step of heating is continuously performed after the step of removing the residue.

10. The method for manufacturing the silicon carbide single crystal according to claim 1, wherein the stress buffer layer is made of a material which is less hard than the seed substrate.

11. The method for manufacturing the silicon carbide single crystal according to claim 1, wherein the stress buffer layer includes a graphite sheet.

* * * * *